(12) United States Patent
Shin et al.

(10) Patent No.: US 12,211,744 B2
(45) Date of Patent: Jan. 28, 2025

(54) METHOD OF FORMING NANOCRYSTALLINE GRAPHENE

(71) Applicant: Samsung Electronics Co., Ltd., Suwon-si (KR)

(72) Inventors: Keunwook Shin, Yongin-si (KR); Hyeonjin Shin, Suwon-si (KR); Alum Jung, Suwon-si (KR); Changseok Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 17/552,756

(22) Filed: Dec. 16, 2021

(65) Prior Publication Data

US 2023/0017244 A1 Jan. 19, 2023

(30) Foreign Application Priority Data

Jul. 16, 2021 (KR) .................. 10-2021-0093750

(51) Int. Cl.
*H01L 21/768* (2006.01)
*C01B 32/186* (2017.01)
(Continued)

(52) U.S. Cl.
CPC ........ *H01L 21/7685* (2013.01); *C01B 32/186* (2017.08); *C23C 16/02* (2013.01); *C23C 16/26* (2013.01); *C23C 16/505* (2013.01); *C23C 16/511* (2013.01); *H01L 21/28562* (2013.01); *H01L 23/53276* (2013.01); *C01B 2204/22* (2013.01); *C01P 2006/10* (2013.01);
(Continued)

(58) Field of Classification Search
CPC .......... H01L 21/7685; H01L 21/28562; H01L 23/53276; H01L 23/53209; H01L 23/53223; H01L 23/53238; H01L 23/53266; C01B 32/186; C01B 2204/22; C23C 16/02; C23C 16/26; C23C 16/505; C23C 16/511; C01P 2006/10
See application file for complete search history.

(56) References Cited

U.S. PATENT DOCUMENTS 8,476,765 B2 7/2013 Zhang et al.
8,541,769 B2 9/2013 Chu et al.
(Continued)

FOREIGN PATENT DOCUMENTS

KR 101583135 B1 1/2016
KR 2020/0012237 A 2/2020
(Continued)

*Primary Examiner* — Julia Slutsker
(74) *Attorney, Agent, or Firm* — HARNESS, DICKEY & PIERCE, P.L.C.

(57) ABSTRACT

A method of forming nanocrystalline graphene according to an embodiment may include: arranging a substrate having a pattern in a reaction chamber; injecting a reaction gas into the reaction chamber, where the reaction gas includes a carbon source gas, an inert gas, and a hydrogen gas that are mixed; generating a plasma of the reaction gas in the reaction chamber; and directly growing the nanocrystalline graphene on a surface of the pattern using the plasma of the reaction gas at a process temperature. The pattern may include a first material and the substrate may include a second material different from the first material.

20 Claims, 22 Drawing Sheets

(51) Int. Cl.
  *C23C 16/02* (2006.01)
  *C23C 16/26* (2006.01)
  *C23C 16/505* (2006.01)
  *C23C 16/511* (2006.01)
  *H01L 21/285* (2006.01)
  *H01L 23/532* (2006.01)
(52) U.S. Cl.
  CPC .. *H01L 23/53209* (2013.01); *H01L 23/53223* (2013.01); *H01L 23/53238* (2013.01); *H01L 23/53266* (2013.01)

(56) References Cited

U.S. PATENT DOCUMENTS

| | | | |
|---|---|---|---|
| 9,482,960 | B2 | 11/2016 | Yakunin et al. |
| 10,003,028 | B2 | 6/2018 | Barth |
| 10,312,329 | B2 | 6/2019 | Zhou |
| 10,850,985 | B2 | 12/2020 | Jung et al. |
| 11,069,619 | B2 | 7/2021 | Nam et al. |
| 11,094,538 | B2 | 8/2021 | Shin et al. |
| 2019/0161351 | A1* | 5/2019 | Song ................ H01L 21/02527 |
| 2019/0348466 | A1 | 11/2019 | Pillarisetty et al. |
| 2020/0039827 | A1* | 2/2020 | Jung .................... H01L 29/413 |
| 2020/0052549 | A1 | 2/2020 | Sohn |
| 2020/0294928 | A1 | 9/2020 | Byun et al. |
| 2020/0354829 | A1 | 11/2020 | Song et al. |
| 2021/0082832 | A1 | 3/2021 | Yang et al. |

FOREIGN PATENT DOCUMENTS

| | | |
|---|---|---|
| KR | 2020/0015279 A | 2/2020 |
| KR | 2020/0037638 A | 4/2020 |
| KR | 2020/0128975 A | 11/2020 |
| WO | WO-2021/067118 A1 | 4/2021 |

\* cited by examiner

METHOD OF FORMING NANOCRYSTALLINE GRAPHENE

CROSS-REFERENCE TO RELATED APPLICATION

This application is based on and claims priority under 35 U.S.C. § 119 to Korean Patent Application No. 10-2021-0093750, filed on Jul. 16, 2021, in the Korean Intellectual Property Office, the disclosure of which is incorporated by reference herein in its entirety.

BACKGROUND

1. Field

The present disclosure relates to methods of forming nanocrystalline graphene, and more particularly, to methods of selectively growing nanocrystalline graphene on an upper surface of a substrate having a desired and/or alternatively predetermined pattern by using a plasma chemical vapor deposition method.

2. Description of the Related Art

In recent years, the size of semiconductor devices has been gradually reduced in order to achieve high integration of the semiconductor devices. To this end, it may be necessary to reduce a line width of a conductive wiring including a metal or a metal alloy in an interconnect structure. On the other hand, when a line width of a conductive wiring is reduced, current density in the conductive wiring may increase, and as a result, the resistance of the conductive wiring may increase. The increase in resistance of a conductive wiring may cause electromigration of metal or metal alloy atoms constituting the conductive wiring, thereby causing defects in the conductive wiring. Therefore, it may be necessary to provide a cap layer that reduces the resistance of the conductive wiring.

Nanocrystalline graphene may be selectively arranged on the cap layer to reduce the resistance of the conductive wiring. Graphene is a crystalline material having a hexagonal honeycomb structure, in which carbon atoms are two-dimensionally connected, and has a very small thickness at an atomic scale. Such graphene may be synthesized by chemical vapor deposition (CVD), or obtained by detaching graphite layer by layer at a time. Graphene generally includes crystals having a size at a micrometer level. On the other hand, nanocrystalline graphene refers to graphene including crystals having a nano-level size.

SUMMARY

Provided are methods of selectively growing nanocrystalline graphene on a substrate including a desired and/or alternatively predetermined pattern by using a plasma chemical vapor deposition method.

Additional aspects will be set forth in part in the description which follows and, in part, will be apparent from the description, or may be learned by practice of the presented embodiments of the disclosure.

According to an embodiment, a method of forming a nanocrystalline graphene includes: arranging a substrate having a desired and/or alternatively predetermined pattern in a reaction chamber; injecting a reaction gas into the reaction chamber, the reaction gas including a carbon source gas, an inert gas, and a hydrogen gas that are mixed; generating a plasma of the reaction gas in the reaction chamber; and directly growing the nanocrystalline graphene on a surface of the desired and/or alternatively predetermined pattern by using the plasma of the reaction gas at a desired and/or alternatively predetermined process temperature. The desired and/or alternatively predetermined pattern may include a first material and the substrate may include a second material different from the first material.

In some embodiments, the first material may include a metal or metal alloy including at least one of Cu, Ru, Rh, Ir, Mo, W, Pd, Pt, Co, Ta, Ni, Al, and Ti.

In some embodiments, the second material may include a dielectric material having a dielectric constant of 3.6 or less.

In some embodiments, while the directly growing the nanocrystalline graphene is performed using the plasma, a volume ratio of the hydrogen gas and the inert gas may be in a range from about 5:100 to about 100:1.

In some embodiments, the generating the plasma of the reaction gas may be performed using a radio frequency (RF) plasma or a microwave (MW) plasma.

In some embodiments, the RF plasma may have a frequency range of 3 MHz to 100 MHz or a MW plasma having a frequency range of 0.7 GHz to 2.5 GHz.

In some embodiments, the generating the plasma may be performed at a power in a range from about 10 W to about 1500 W.

In some embodiments, the nanocrystalline graphene may be grown at a process temperature of about 550° C. or less.

In some embodiments, the nanocrystalline graphene may be grown at a process pressure in a range from about 0.005 Torr to about 10 Torr.

In some embodiments, the carbon source gas may include at least one of a hydrocarbon gas and a vapor of a precursor including carbon.

In some embodiments, the precursor may include at least one of an aromatic hydrocarbon having a chemical formula of $C_xH_y$ (6≤x≤42, 6≤y≤28) and derivatives thereof, and $C_xH_y$ (1≤x≤12, 2≤y≤26) aliphatic hydrocarbons and their derivatives.

In some embodiments, the inert gas may include at least one of argon gas, nitrogen gas, helium gas, krypton gas, and xenon gas.

In some embodiments, the nanocrystalline graphene may include crystals having a size in a range of about 0.5 nm to about 150 nm.

In some embodiments, in the nanocrystalline graphene, a ratio of carbon having a $sp^2$ bonding structure to the total carbon may be in a range from about 50% to about 99%.

In some embodiments, the pattern may be arranged in a trench shape on the substrate.

In some embodiments, the nanocrystalline graphene may include hydrogen in a range from about 1 at % to about 20 at %.

In some embodiments, the nanocrystalline graphene may have a density in a range of about 1.6 g/cc to about 2.1 g/cc.

In some embodiments, the method may further include pretreating a surface of the substrate using a reducing gas injected into the reaction chamber. The pretreating the surface of the substrate may be performed before the directly growing the nanocrystalline graphene.

In some embodiments, the reducing gas may include at least one of hydrogen, nitrogen, chlorine, fluorine, ammonia, and derivatives thereof.

In some embodiments, an inert gas may be injected into the reaction chamber.

According to an embodiment, a method of forming a nanocrystalline graphene may include arranging a substrate having a pattern in a reaction chamber and selectively growing the nanocrystalline graphene directly on a surface of the pattern and not on a surface of the substrate. The pattern may include a first material and the substrate may include a second material different from the first material. The selectively growing the nanocrystalline graphene may include injecting a reaction gas into the reaction chamber while the substrate having the pattern is in the reaction chamber. The reaction gas may include a carbon source gas, an inert gas, and a hydrogen gas that are mixed.

In some embodiments, the first material may include at least one of Cu, Ru, Rh, Ir, Mo, W, Pd, Pt, Co, Ta, Ni, Al, and Ti, and the second material may include a dielectric material having a dielectric constant of 3.6 or less.

In some embodiments, while the selectively growing the nanocrystalline graphene is performed using the plasma, a volume ratio of the hydrogen gas and the inert gas in the reaction gas may be in a range from about 5:100 to about 100:1, the generating the plasma may be performed at a power in a range from about 10 W to about 1500 W, a process temperature may be about 550° C. or less, and a process pressure may be in a range from about 0.005 Torr to about 10 Torr.

In some embodiments, the carbon source may include at least one of: a hydrocarbon gas; and a vapor of a liquid precursor including carbon.

In some embodiments, the method may further include pretreating a surface of the substrate using a reducing gas injected into the reaction chamber. The pretreating the surface of the substrate may be performed before the selectively growing the nanocrystalline graphene.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
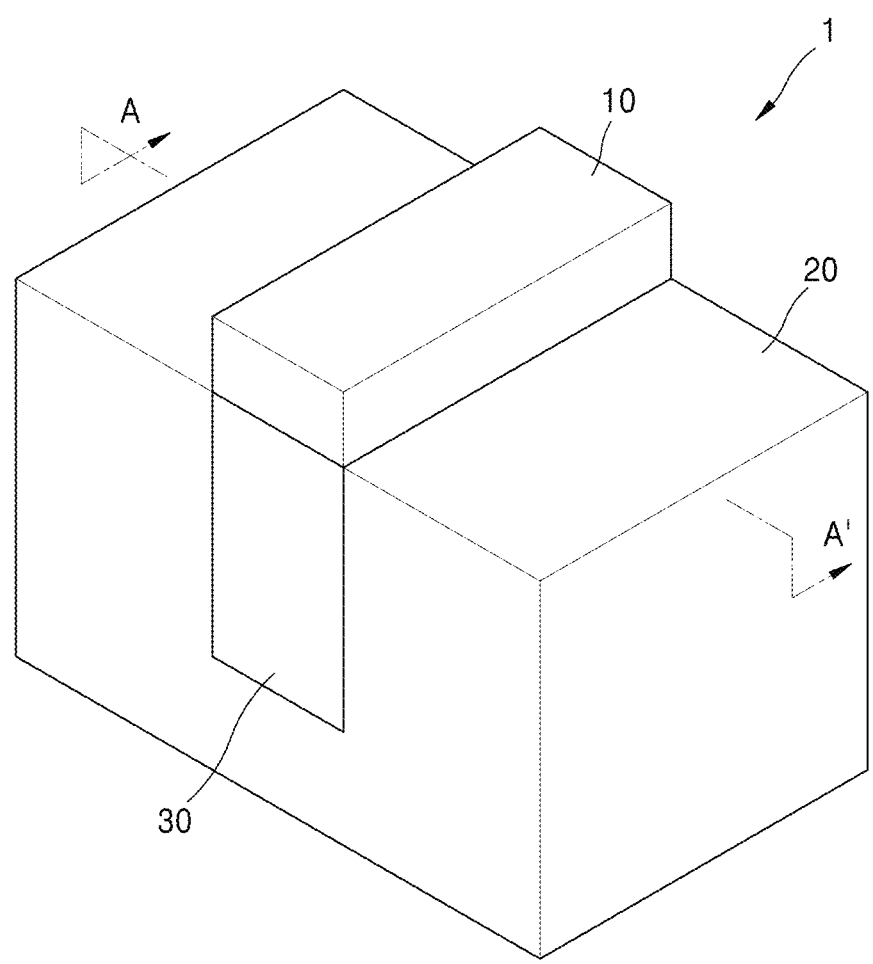
FIG. 1A is a perspective view of an interconnect structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of +/−10% around the stated numerical value. When ranges are specified, the range includes all values therebetween such as increments of 0.1%.

Hereinafter, embodiments of inventive concepts will be described in detail with reference to the accompanying drawings. In the following drawings, like reference numerals refer to like elements, and the size of each component in the drawings may be exaggerated for clarity and convenience of description. The embodiments of inventive concepts may be variously modified and may be embodied in many different forms.

Meanwhile, when an element or layer is referred to as being "on" or "above" another element or layer, the element or layer may be directly on another element or layer or on intervening elements or layers. The singular forms are intended to include the plural forms as well, unless the context clearly indicates otherwise. When a part "comprises" or "includes" an element in the specification, unless otherwise defined, it does not exclude other elements but may further include other elements. The term "above" and similar directional terms may be applied to both singular and plural.

In the following embodiments, methods of growing and forming nanocrystalline graphene in a short time on a surface of a substrate by using a plasma enhanced chemical vapor deposition (PECVD) method will be described. Here, the nanocrystalline graphene refers to graphene including crystals having a nano-level size. General graphene includes crystals having a size of a micrometer level, but nanocrystalline graphene may include crystals having a size of a nanometer level, for example, about 0.5 nm to 150 nm.

Figure 1B:
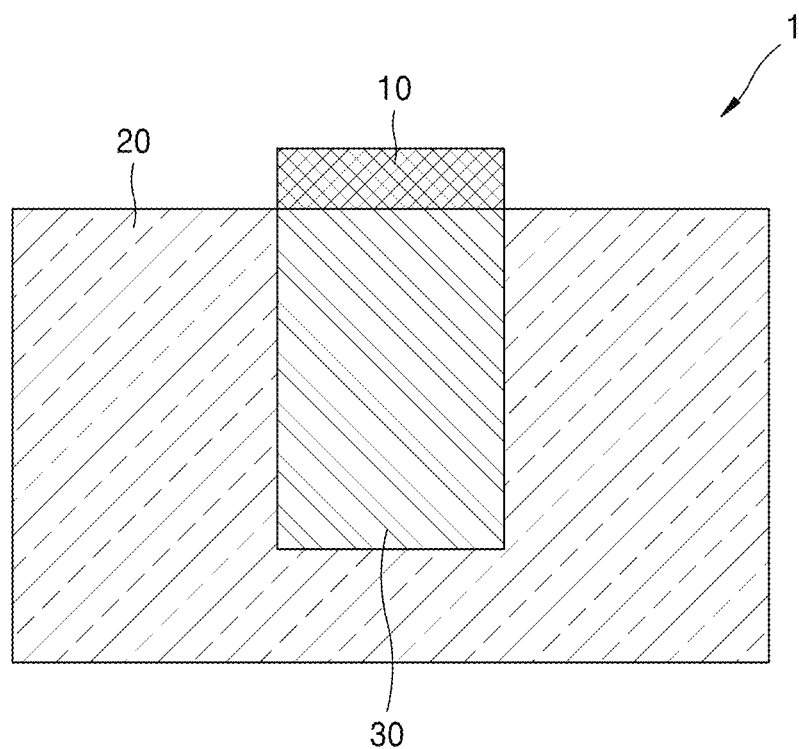
FIG. 1B is a cross-sectional view taken along line A-A' of the interconnect structure shown in FIG. 1A.

FIG. 1A is a perspective view of an interconnect structure 1 according to an embodiment. FIG. 1B is a cross-sectional view taken along line A-A' of the interconnect structure 1 shown in FIG. 1A.

Referring to FIGS. 1A and 1B, the interconnect structure 1 according to an embodiment may include a capping layer 10, a dielectric layer 20, and a conductive wiring 30. As an example, the capping layer 10 may be arranged on an upper surface of the conductive wiring 30 to reduce an electrical resistance of the conductive wiring 30, thereby improving the electromigration resistance. The capping layer 10 according to an embodiment may include nanocrystalline graphene. As an example, when the capping layer 10 including nanocrystalline graphene is arranged on the upper surface of the conductive wiring 30 including a copper wire, compared to the case in which the capping layer 10 is not formed on the upper surface of the conductive wiring 30, the electrical resistance of the conductive wiring 30 may be reduced by about 4% or more.

The dielectric layer 20 may have a single layer or a multilayer structure in which different materials are stacked. The dielectric layer 20 according to an embodiment may include a dielectric material used in a general semiconductor manufacturing process. With the miniaturization of the semiconductor device, the parasitic capacitance of the dielectric layer 20 may be an important factor in improving the performance of a wiring. Accordingly, the dielectric layer 20 may include a material having low dielectric constant (a low-k material) as an interlayer insulating film (inter-metal dielectric (IMD)).

The conductive wiring 30 may include a metal or a metal alloy having high electrical conductivity. With the miniaturization of the semiconductor device, the conductive wiring 30 may have a nano-scale line width, but is not limited thereto. As an example, the dielectric layer 20 may be arranged on a side surface or a lower surface of the conductive wiring 30 except for the upper surface of the conductive wiring 30.

As described above, in order to arrange the capping layer 10 including nanocrystalline graphene only on the upper surface of the conductive wiring 30 except for the dielectric layer 20, selective growth of nanocrystalline graphene may be required. Hereinafter, a method of forming nanocrystalline graphene that is selectively grown only on an upper surface of a pattern of a substrate having a desired and/or alternatively predetermined pattern will be described in more detail.

FIGS. 2A to 2D are views for explaining a method of forming nanocrystalline graphene according to an embodiment. FIG. 3A shows Raman spectra showing whether nanocrystalline graphene is grown in a short time on a desired and/or alternatively predetermined pattern according to an embodiment. FIG. 3B shows Raman spectra showing whether nanocrystalline graphene is grown in a short time on a substrate according to an embodiment.

Figure 2A:
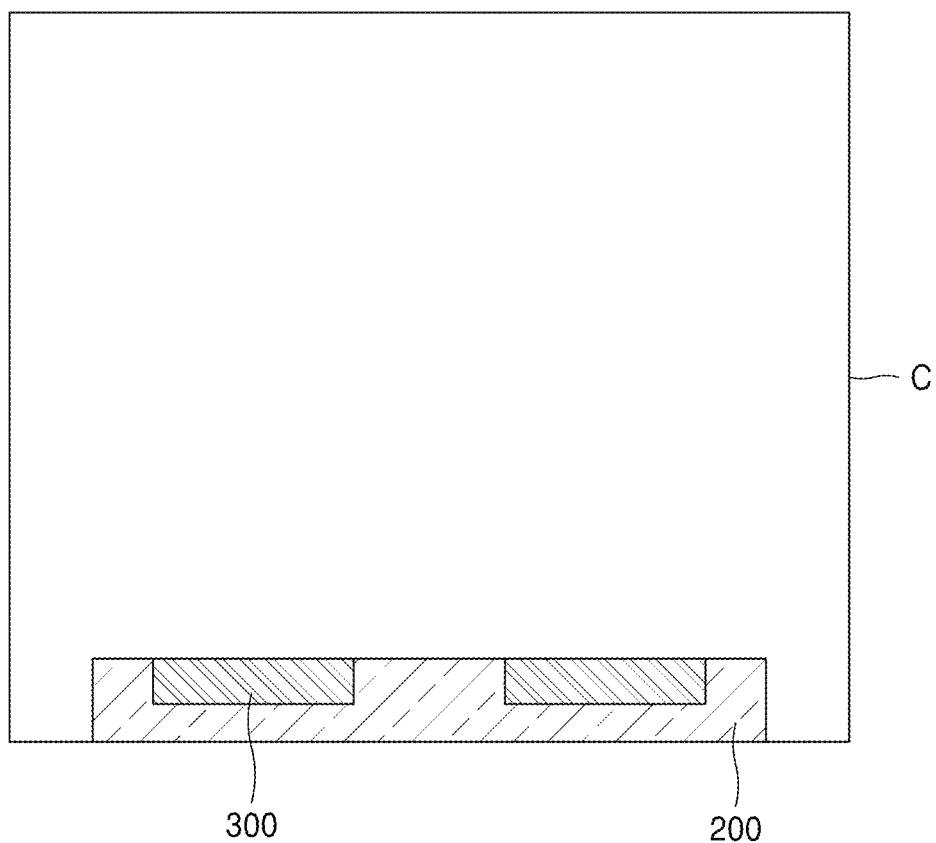
FIGS. 2A to 2D are views for explaining a method of forming nanocrystalline graphene according to an embodiment.

Referring to FIG. 2A, power for plasma generation is applied to an inside of a reaction chamber C in which the substrate 200 is provided, and a reaction gas for growing nanocrystalline graphene (100 in FIG. 2D) is injected into the reaction chamber.

Specifically, first, a substrate 200 having a desired and/or alternatively predetermined pattern 300 for growing nanocrystalline graphene 100 in a reaction chamber is prepared. In the present embodiment, nanocrystalline graphene 100 may be selectively grown on a surface of the desired and/or alternatively predetermined pattern 300.

As an example, the substrate 200 may have a shape of a flat plate extending along one plane. For example, the substrate 200 may include a second material, for example, a dielectric material having a dielectric constant of, for example, about 3.6 or less, for example, about 3.3 or less, or, for example, about 3.0 or less. For example, the substrate 200 may include $Al_2O_3$, AlN, $ZrO_2$, $HfO_x$ (0<x<4), $SiO_2$, SiCO, SiCN, SiON, SiCOH, AlSiO, or boron nitride (BN). However, the present embodiment is not limited thereto and various other dielectric materials may be included in the substrate 200. Also, the substrate 200 may include an organic dielectric material.

The desired and/or alternatively predetermined pattern 300 may be arranged in a trench shape provided on the substrate 200. For example, the desired and/or alternatively predetermined pattern 300 may be provided in the form of a conductive wiring having a nano-scale line width extending in one direction. However, the present disclosure is not limited thereto. As an example, the desired and/or alternatively predetermined pattern 300 may include a first material different from the second material described above, for example, one or more metals or metal alloys selected from Cu, Ru, Rh, Ir, Mo, W, Pd, Pt, Co, Ta, Ni, Al and Ti.

Figure 2B:
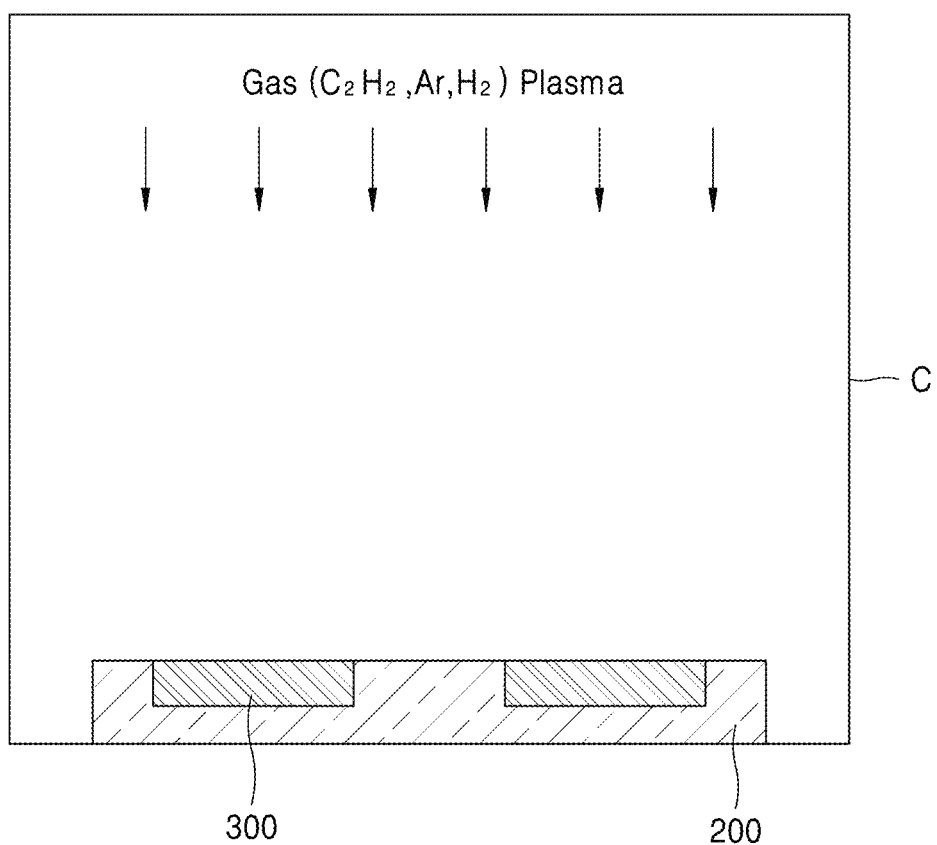

Next, referring to FIG. 2B, power for plasma generation is applied to the inside of the reaction chamber C from a plasma power source (not shown). Here, the power for plasma generation may be in a range of about 10 W to about 1500 W. However, the present disclosure is not limited thereto.

As the plasma power source, for example, a radio frequency (RF) plasma generator or a microwave (MW) plasma generator may be used. Here, in order to grow the nanocrystalline graphene 100, the RF plasma generator may generate an RF plasma having a frequency range of, for example, about 3 MHz to about 100 MHz, and the MW plasma generator may generate, for example, MW plasma having a frequency range of about 0.7 GHz to about 2.5 GHz. However, the frequency regions are merely examples and other frequency regions may also be used. Meanwhile, a plurality of RF plasma generators or a plurality of MW plasma generators may be used as the plasma power source.

When power for plasma generation is applied to the inside of the reaction chamber C from a plasma power source, an electric field may be induced in the inside of the reaction chamber C. In a state in which an electric field is induced in this way, a reaction gas for growth of the nanocrystalline graphene 100 is injected into the reaction chamber C.

As a reaction gas for the growth of the nanocrystalline graphene 100, a mixed gas of a carbon source gas, an inert gas, and a hydrogen gas may be used. The carbon source gas may be a gas that supplies carbon for the growth of the nanocrystalline graphene 100. For example, the carbon source gas may include at least one of hydrocarbon gas and a vapor of a liquid precursor including carbon. The carbon source gas may include, for example, at least one of methane gas, ethylene gas, and acetylene gas, but is not limited thereto. In addition, the liquid precursor may include at least one of an aromatic hydrocarbon having a chemical formula of $C_xH_y$ (6≤x≤42, 6≤y≤28) and a derivative thereof and an aliphatic hydrocarbon having a chemical formula of $C_xH_y$ (1≤x≤12, 2≤y≤26) and a derivative thereof. Here, the aromatic hydrocarbon may include, for example, benzene, toluene, xylene, or anisole, and the aliphatic hydrocarbon may include, for example, hexane, octane, isopropyl alcohol or ethanol. However, these are merely examples.

The inert gas may include, for example, at least one of argon gas, nitrogen gas, helium gas, krypton gas, and xenon gas. In FIG. 2B, as an example, an acetylene gas is used as the carbon source gas and an argon gas is used as the inert gas.

In the case of growing the nanocrystalline graphene 100 by using plasma, a volume ratio of the carbon source gas, the inert gas, and the hydrogen gas injected into the reaction chamber C is, for example, approximately 1 to 20:5 to 100:1 to 100. In this case, a volume ratio of the inert gas and the hydrogen gas for selectively growing the nanocrystalline graphene 100 only on an upper surface of the desired and/or alternatively predetermined pattern 300 may be, for example, in a range of about 5:100 to about 100:1.

The process temperature for growing the nanocrystalline graphene 100 may be about 550° C. or less, which is less than a temperature used in a general chemical vapor deposition process. As a specific example, the process temperature inside the reaction chamber C may be in a range of about 300° C. to about 550° C.

Also, the process pressure for growing the nanocrystalline graphene 100 may be in a range of about 0.005 Torr to about 10 Torr. However, this is merely an example and other process pressures may be used.

As described above, when a reaction gas in which a carbon source gas, an inert gas, and a hydrogen gas are mixed is introduced into the reaction chamber C, the reaction gas is changed to a plasma state by an electric field applied for plasma power.

Figure 2C:
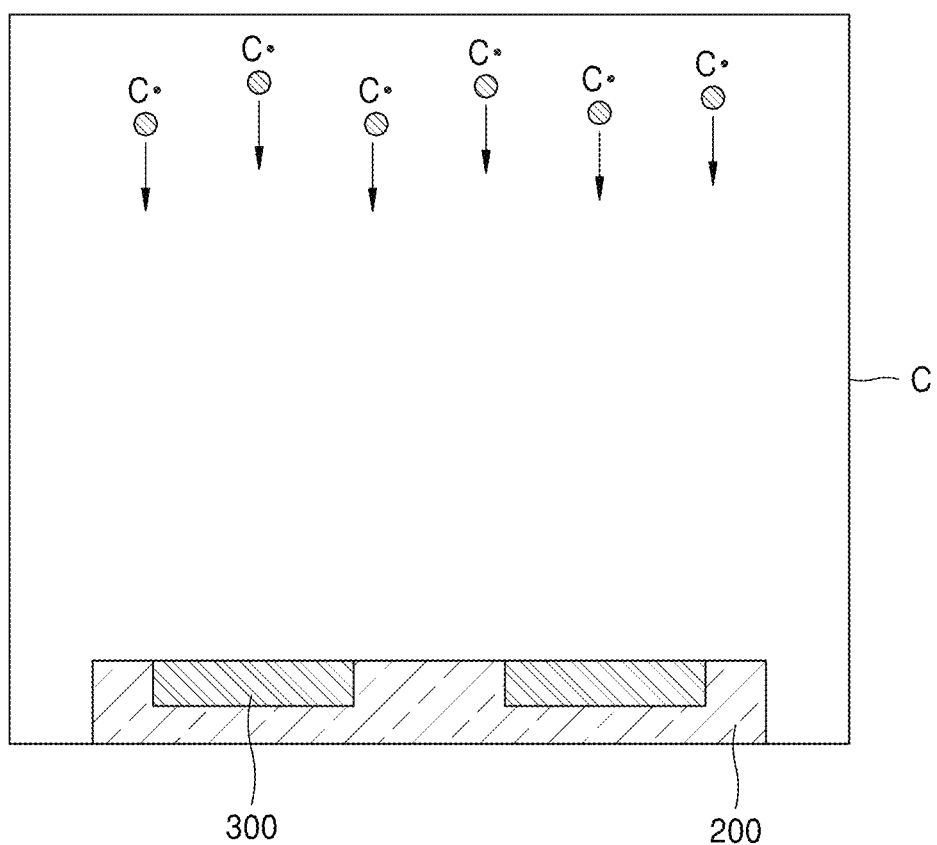

Referring to FIG. 2C, active carbon radicals C are generated by plasma of a reaction gas in which a carbon source gas, an inert gas, and a hydrogen gas are mixed and are adsorbed to a surface of a desired and/or alternatively predetermined pattern 300. Specifically, plasma of an inert gas in the reaction gas generates activated carbon radicals C from the carbon source gas, and the activated carbon radicals C generated in this way are adsorbed on the surface of the desired and/or alternatively predetermined pattern 300, and thus, the surface of the desired and/or alternatively predetermined pattern 300 is activated. In addition, because the plasma of the inert gas continuously induces activation of the desired and/or alternatively predetermined pattern 300, adsorption of activated carbon radicals C on the surface of the desired and/or alternatively predetermined pattern 300 may be accelerated.

Figure 2D:
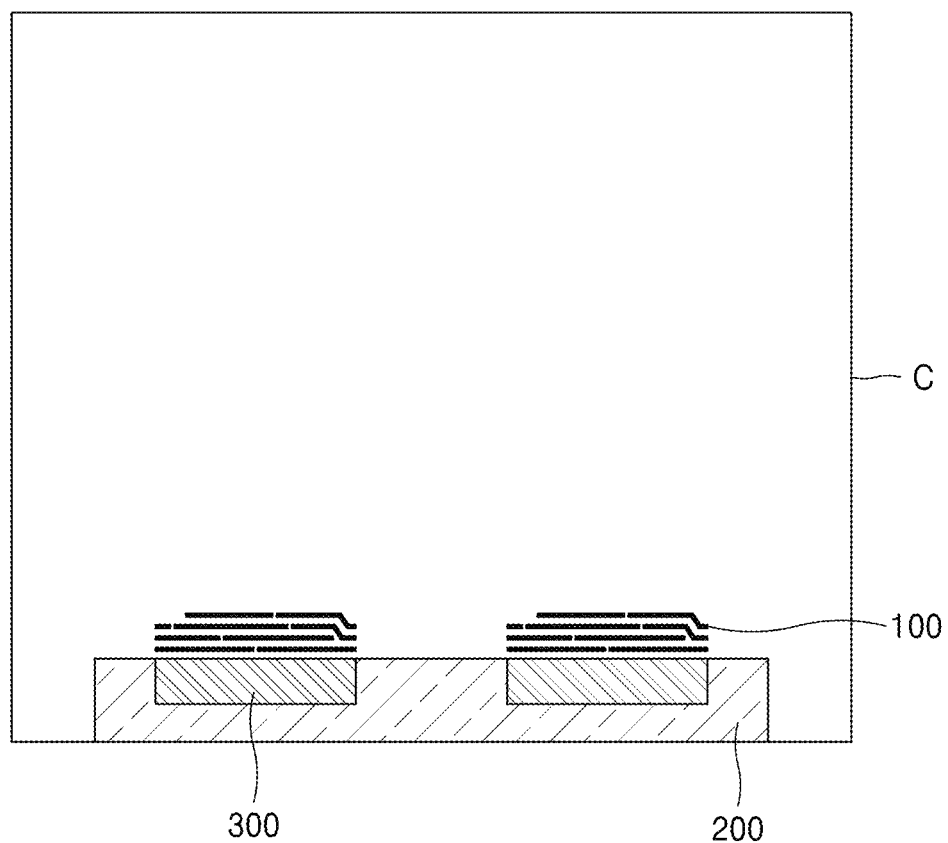
Figure 3A:
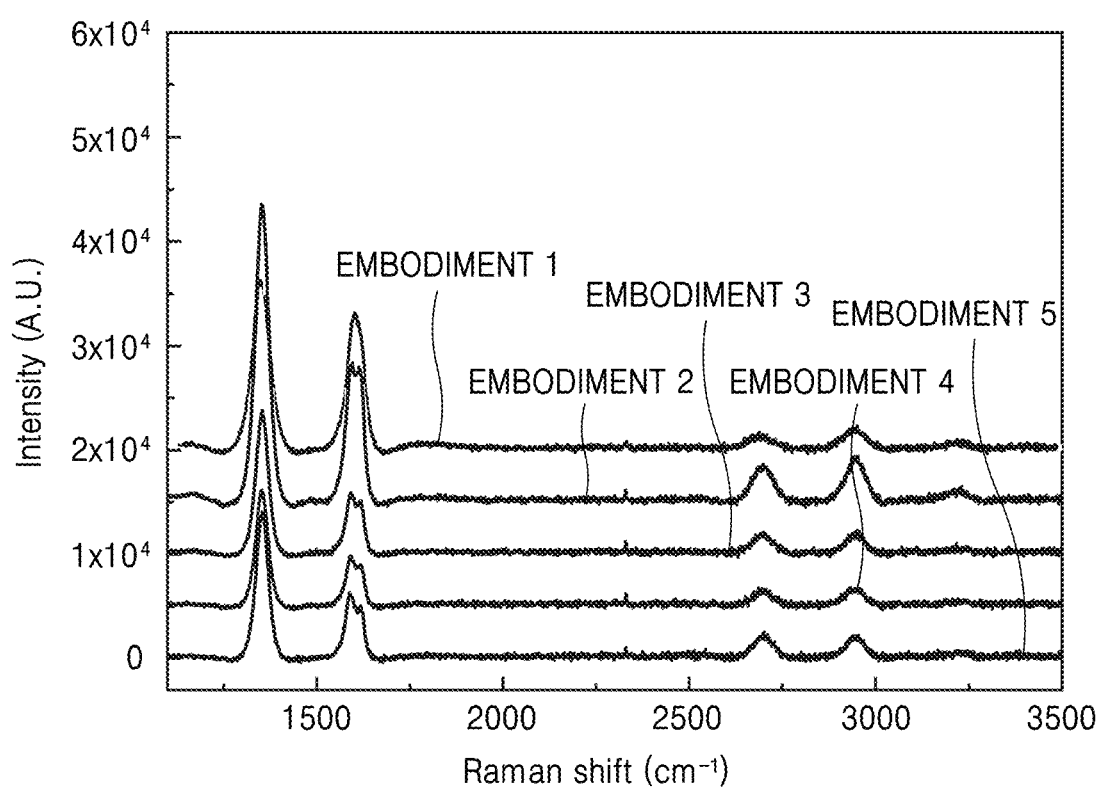
FIG. 3A shows Raman spectra showing whether nanocrystalline graphene is grown in a short time on a desired and/or alternatively predetermined pattern according to an embodiment.
Figure 3B:
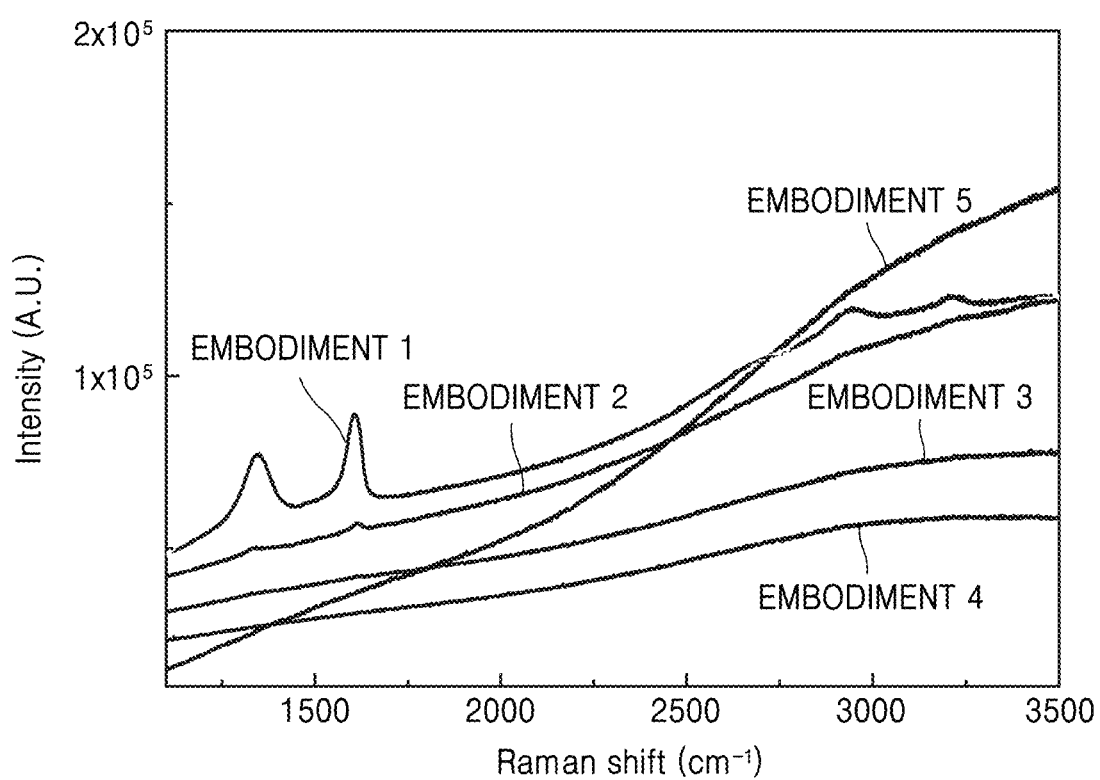
FIG. 3B shows Raman spectra showing whether nanocrystalline graphene is grown in a short time on a substrate according to an embodiment.

Referring to FIG. 2D, as described above, as the adsorption of activated carbon radicals C on the surface of the desired and/or alternatively predetermined pattern 300 is accelerated, the nanocrystalline graphene 100 may be grown in a short time on the surface of the desired and/or alternatively predetermined pattern 300.

Accordingly, the nanocrystalline graphene 100 may be grown at a relatively high speed on the surface of the desired and/or alternatively predetermined pattern 300. For example, the nanocrystalline graphene 100 may be grown to a thickness of 0.05 nm or more per minute on the surface of the desired and/or alternatively predetermined pattern 300. However, the present embodiment is not limited thereto. Accordingly, the nanocrystalline graphene 100 may be grown to a desired thickness within a relatively short time. For example, the time for which the nanocrystalline graphene 100 is grown on the surface of the desired and/or alternatively predetermined pattern 300 may be, for example, 60 minutes or less. For a more specific example, the growth time of the nanocrystalline graphene 100 may be 30 minutes or less or 10 minutes or less. However, the present embodiment is not limited thereto. In this way, the nanocrystalline graphene 100 having a desired thickness may be directly formed on the surface of the desired and/or alternatively predetermined pattern 300 within a relatively short time due to the plasma of the inert gas. The nanocrystalline graphene 100 may have a single-layer or a multi-layer structure.

According to the present embodiment, in the plasma chemical vapor deposition process, a mixed gas of a carbon source gas, an inert gas, and a hydrogen gas is used as a reactive gas and the surface of the desired and/or alternatively predetermined pattern 300 is activated by plasma of the inert gas among the mixed gas, and thus, even at a relatively low temperature of 550° C. or less, the nanocrystalline graphene 100 may be directly grown on the surface of the desired and/or alternatively predetermined pattern 300 in a relatively short time without a catalyst.

The nanocrystalline graphene 100 described above may include crystals having a size less than that of general crystalline graphene. As a specific example, the nanocrystalline graphene 100 may include crystals having a size in a range from about 0.5 nm to about 70 nm. In the nanocrystalline graphene 100, a ratio of carbon having a $sp^2$ bond structure to a total carbon may be, for example, in a range from about 50% to about 99%. The nanocrystalline graphene 100 may include hydrogen, for example, in a range from about 1 at % (atomic percent) to about 20 at %. In addition, the nanocrystalline graphene 100 may have a density of, for example, about 1.6 g/cc to about 2.1 g/cc, and a sheet resistance of, for example, greater than about 1000 Ohm/sq.

FIG. 3A shows a Raman spectrum obtained by measuring a surface of a desired and/or alternatively predetermined pattern. FIG. 3B shows a Raman spectrum measured on a surface of the substrate. In the embodiments 1 to 5, a copper (Cu) wiring was arranged in the desired and/or alternatively predetermined pattern 300, and a polysilicon substrate was used for the substrate 200. As the plasma power source, RF power (13.58 MHz) was used. Power for RF plasma generation was 50 W. As growth conditions, a growth temperature of 400° C., a process pressure of 0.02 Torr, and a growth time of 30 minutes were used. Here, as the carbon source gas, inert gas, and hydrogen gas included in the embodiment 1, 5 sccm of acetylene gas, 100 sccm of argon gas, and 0 sccm of hydrogen gas were used, respectively. As the carbon source gas, inert gas, and hydrogen gas included in the embodiment 2, 5 sccm of acetylene gas, 75 sccm of argon gas, and 25 sccm of hydrogen gas were used, respectively. As the carbon source gas, inert gas, and hydrogen gas included in the embodiment 3, 5 sccm of acetylene gas, 50 sccm of argon gas, and 50 sccm of hydrogen gas were used, respectively. As the carbon source gas, inert gas, and hydrogen gas included in the embodiment 4, 5 sccm of acetylene gas, 25 sccm of argon gas, and 75 sccm of hydrogen gas were used, respectively. As the carbon source gas, inert gas, and hydrogen gas included in the embodiment 5, 5 sccm of acetylene gas, 0 sccm of argon gas, and 100 sccm of hydrogen gas were used, respectively.

Referring to FIG. 3A, 2D peak, D peak, and G peak appear in the spectrum for an upper part of the desired and/or alternatively predetermined pattern 300 according to the embodiments 1 to 5, and thus, it may be seen that nanocrystalline graphene is grown and formed in a short time of 10 minutes on the surface of the substrate. In this case, the measured thickness of the nanocrystalline graphene is about 2 nm.

Referring to FIG. 3B, in the spectrum for the upper part of the substrate 200 according to the embodiments 1 to 5, 2D peak, D peak, and G peak are not appeared in the embodiments 2 to 5 except for the embodiment 1 in which hydrogen gas is not included, and thus, it may be seen that the nanocrystalline graphene 100 does not grow on the surface of the substrate 200. That is, it may be confirmed that the nanocrystalline graphene 100 is selectively formed on the substrate 200 and the desired and/or alternatively predetermined pattern 300 according to a ratio of included hydrogen gas.

Figure 4:
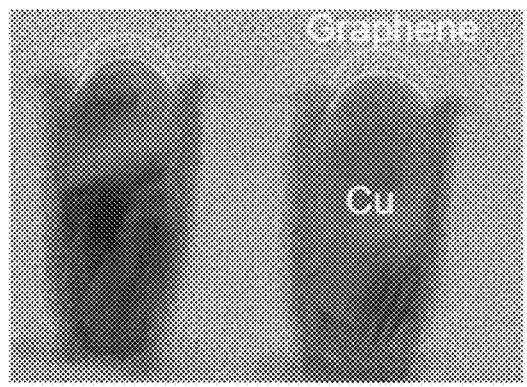
FIG. 4 is a transmission electron microscope (TEM) image showing nanocrystalline graphene grown and formed on a copper pattern by using radio frequency (RF) plasma, according to an embodiment.

FIG. 4 is a transmission electron microscope (TEM) image showing nanocrystalline graphene grown and formed on a copper pattern by using a radio frequency (RF) plasma according to an embodiment.

In FIG. 4, an RF power (13.58 MHz) was used as plasma power, and the power for generating the RF plasma was 50 W. As growth conditions, a growth temperature of 700° C., a process pressure of 0.02 Torr, and a growth time of 30 minutes were used. In addition, acetylene gas, inert gas, and hydrogen gas included in the reaction gas were acetylene gas of 5 sccm, argon gas of 50 sccm, and hydrogen gas of 50 sccm, respectively.

Referring to FIG. 4, it may be seen that nanocrystalline graphene is grown to a thickness of about 2 nm on a surface of the copper substrate in a relatively short time of 30 minutes.

Figure 5A:
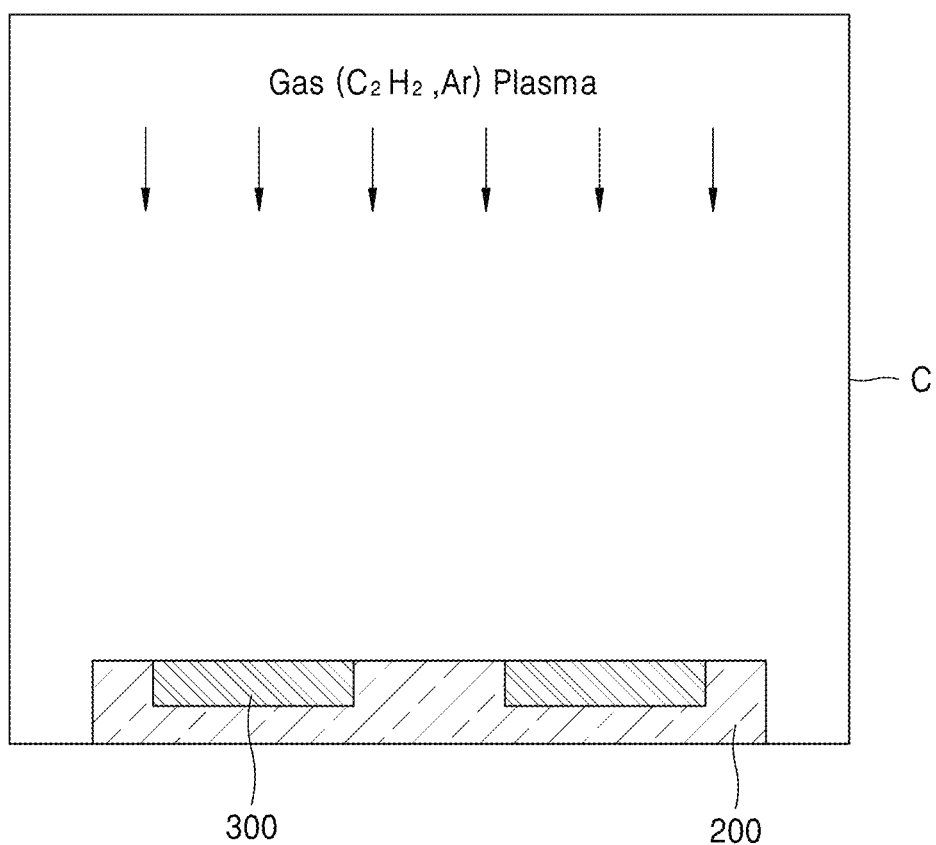
FIGS. 5A and 5B are views for explaining a method of forming nanocrystalline graphene according to a comparative example.
Figure 5B:
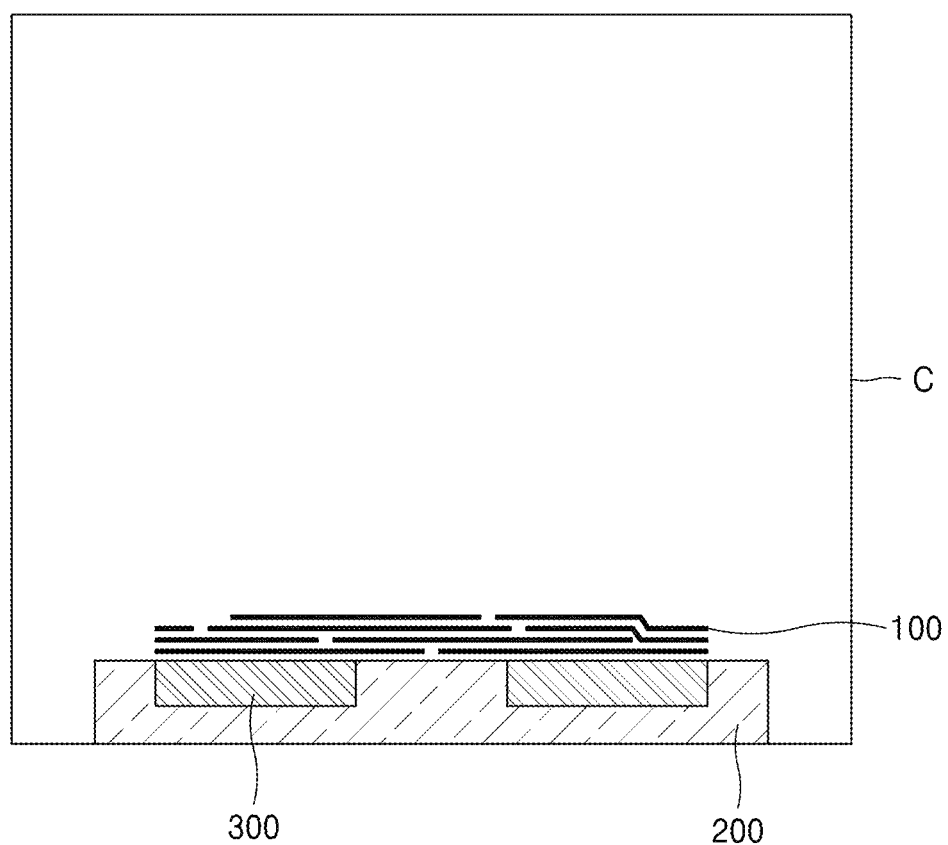
Figure 6:
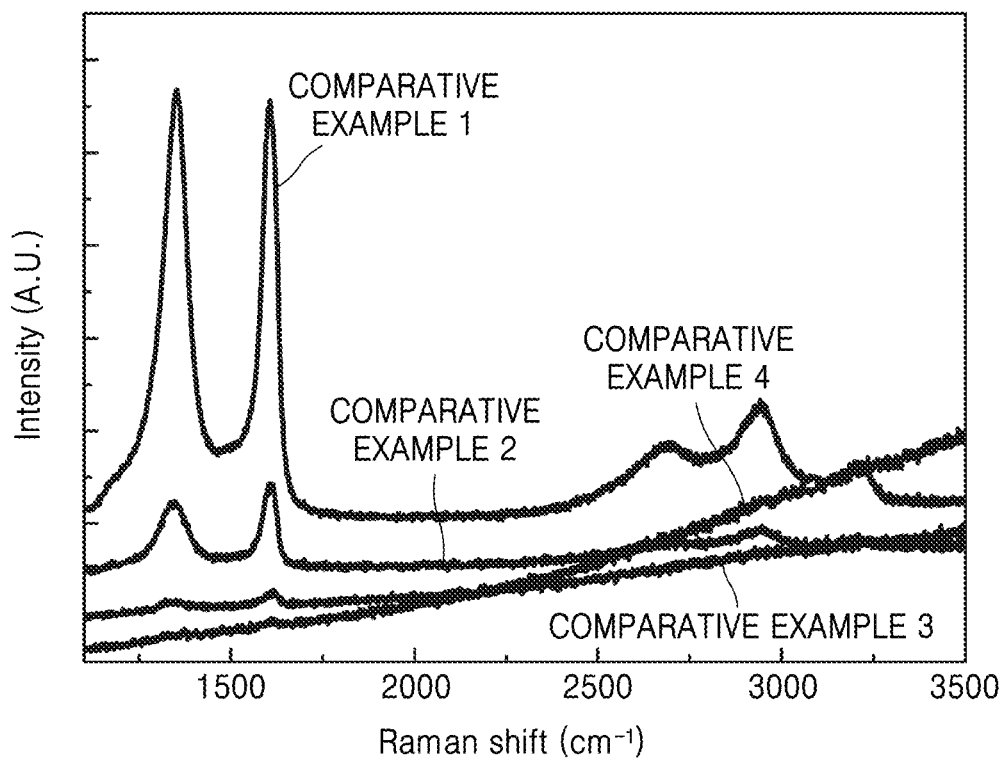
FIG. 6 shows Raman spectra showing whether nanocrystalline graphene is grown in a short time on a desired and/or alternatively predetermined pattern and substrate according to an embodiment.

FIGS. 5A and 5B are views for explaining a method of forming nanocrystalline graphene according to a comparative example. FIG. 6 shows Raman spectra showing whether nanocrystalline graphene is grown in a short time on a desired and/or alternatively predetermined pattern and substrate according to an embodiment.

Referring to FIGS. 5A and 5B, as a reaction gas for growing the nanocrystalline graphene 100, a mixed gas of a carbon source gas and an inert gas may be used. That is, in FIG. 5A, it is depicted that an acetylene gas was used as a carbon source gas and an argon gas was used as an example. In the comparative examples 1 to 4, a copper (Cu) wiring was arranged on the desired and/or alternatively predetermined pattern 300, and a $SiO_2$ substrate was used for the substrate 200. As growth conditions, a growth temperature of 400° C., a process pressure of 20 mTorr, and a growth time of 30 minutes were used. As the carbon source gas and the inert gas included in the reaction gas, 5 sccm of acetylene gas and 100 sccm of argon gas were used, respectively.

As the plasma power source, RF power (13.58 MHz) was used. In the comparative example 1, the power for generating the RF plasma was 50 W. In the comparative example 2, the power for generating the RF plasma was 100 W. In the comparative example 3, the power for generating the RF plasma was 150 W. In the comparative example 4, the power for generating the RF plasma was 200 W.

FIG. 6 shows Raman spectra of the nanocrystalline graphene 100 formed on the desired and/or alternatively predetermined pattern 300 and the substrate 200 as a comparative example in which a volume ratio of hydrogen gas to inert gas in the reaction gas is 0. Referring to FIG. 6, 2D peak, D peak, and G peak appear in the spectrum for the upper parts of the desired and/or alternatively predetermined pattern 300 and the substrate 200 according to comparative examples 1 to 4, and thus, it may be seen that the nanocrystalline graphene 100 is grown and formed on the surfaces of the desired and/or alternatively predetermined pattern 300 and the substrate 200 within a short time of 30 minutes. That is, in comparative examples 1 to 4 in which the volume ratio of hydrogen gas to inert gas is 0, 2D peak, D peak, and G peak appear in the entire area of the desired and/or alternatively predetermined pattern 300 and the substrate 200, and thus, it may be seen that the nanocrystalline graphene 100 is grown on the entire surface of the desired and/or alternatively predetermined pattern and the substrate 200. That is, when the volume ratio of the hydrogen gas to the inert gas is 0, the nanocrystalline graphene 100 may be generated in the entire area of the substrate 200 and the desired and/or alternatively predetermined pattern 300. Accordingly, when the volume ratio of the hydrogen gas to the inert gas is 0, it may be confirmed that the nanocrystalline graphene 100 is not selectively formed on the upper part of the desired and/or alternatively predetermined pattern 300.

Figure 7A:
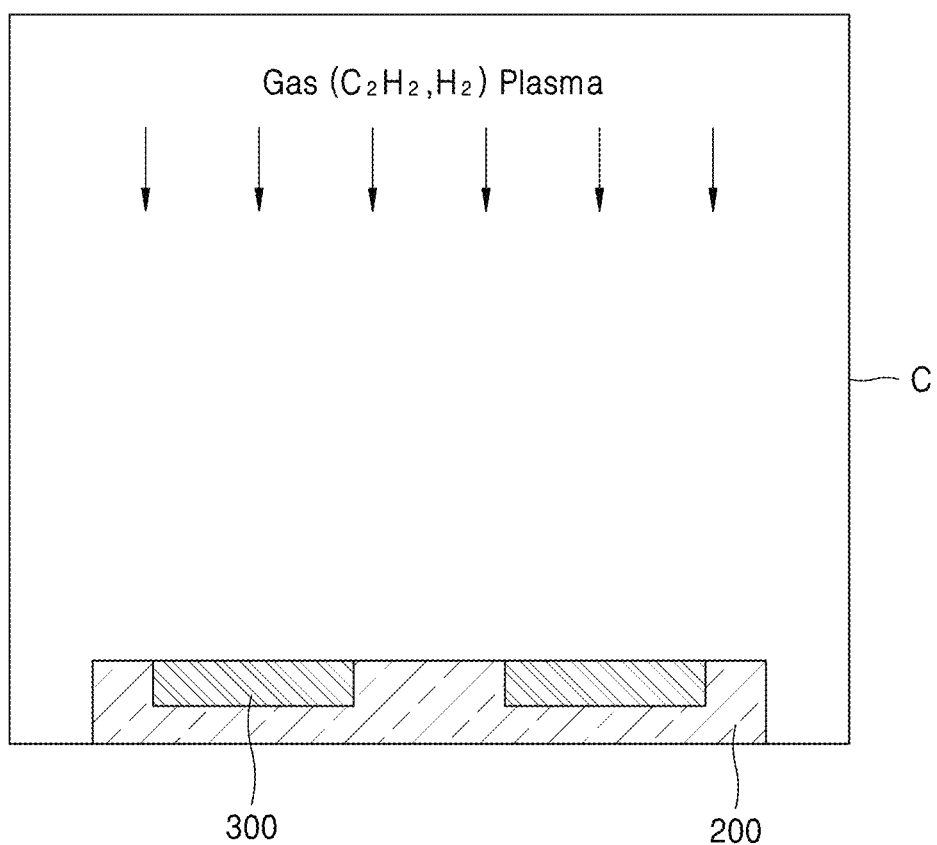
FIGS. 7A to 7B are views for explaining a method of forming nanocrystalline graphene according to a comparative example.
Figure 7B:
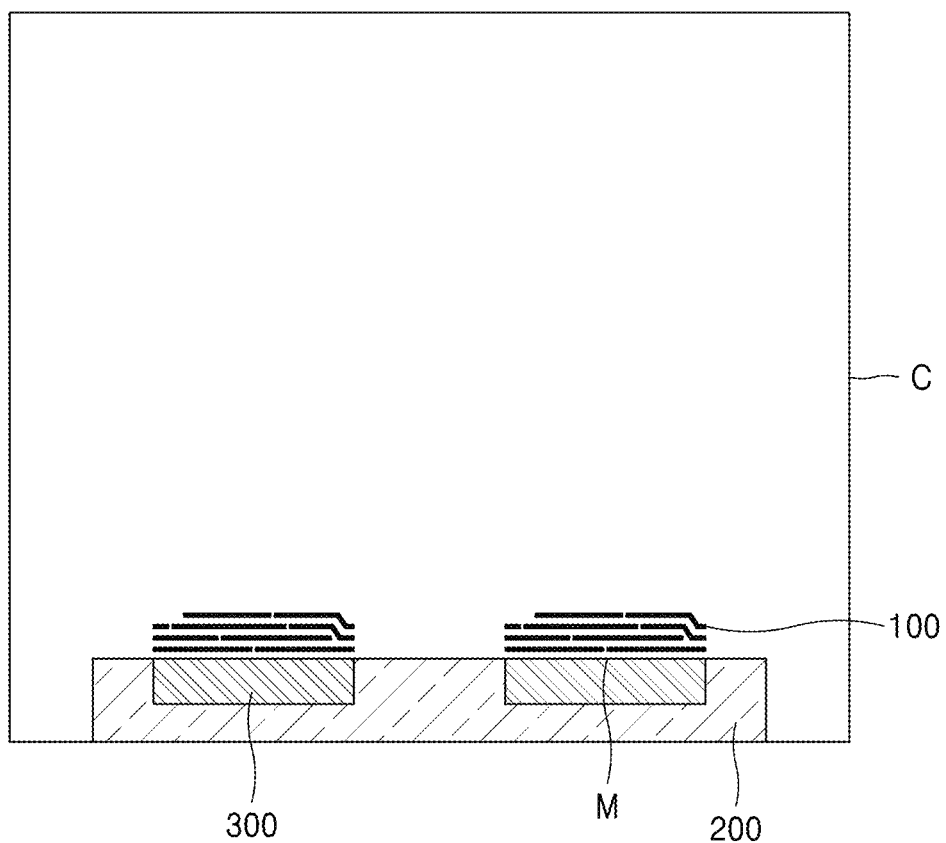
Figure 8:
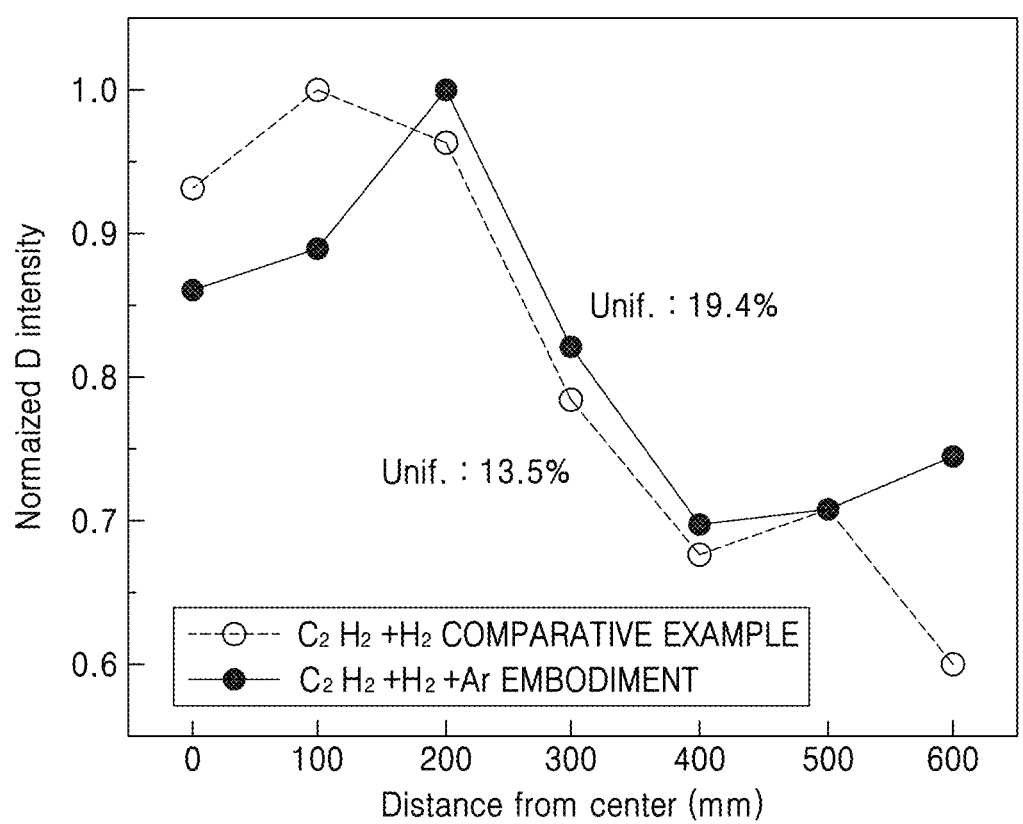
FIG. 8 is a graph showing the uniformity of nanocrystalline graphene according to an embodiment and a comparative example.

FIGS. 7A to 7B are views for explaining a method of forming the nanocrystalline graphene 100 according to a comparative example. FIG. 8 is a graph showing the uniformity of the nanocrystalline graphene 100 according to an embodiment and a comparative example.

Referring to FIGS. 7A to 7B, the method of forming the nanocrystalline graphene 100 is substantially the same as the method of forming the graphene 100 shown in FIGS. 2A to 2D except that a mixed gas of a carbon source gas and a hydrogen gas is used as a reaction gas for the growth of the nanocrystalline graphene 100. That is, in FIG. 7A, an acetylene gas is used as a carbon source gas and a hydrogen gas is used as an example.

FIG. 8 shows normalized Raman spectra showing the uniformity of nanocrystalline graphene 100 formed on a desired and/or alternatively predetermined pattern 300 in an embodiment in which an inert gas is included in the reactive gas and in a comparative example in which the inert gas is not included. In FIG. 8, in the embodiment and the comparative example, a Raman intensity at a point with the highest Raman intensity is set to 1, and the uniformity of the nanocrystalline graphene 100 according to the spread out from the center M of the nanocrystalline graphene 100 is shown.

Referring to FIG. 8, it may be confirmed that, in the embodiment in which an inert gas is included in the reaction gas, the uniformity of the nanocrystalline graphene 100 is 19.4%. In the comparative example in which an inert gas is not included in the reaction gas, the uniformity of the nanocrystalline graphene 100 is 13.5%. In this way, it may be seen that, when the reaction gas includes an inert gas, the relatively uniform nanocrystalline graphene 100 may be directly grown on the desired and/or alternatively predetermined pattern 300.

FIGS. 9A to 9E are views for explaining a method of forming nanocrystalline graphene according to an embodiment.

Figure 9A:
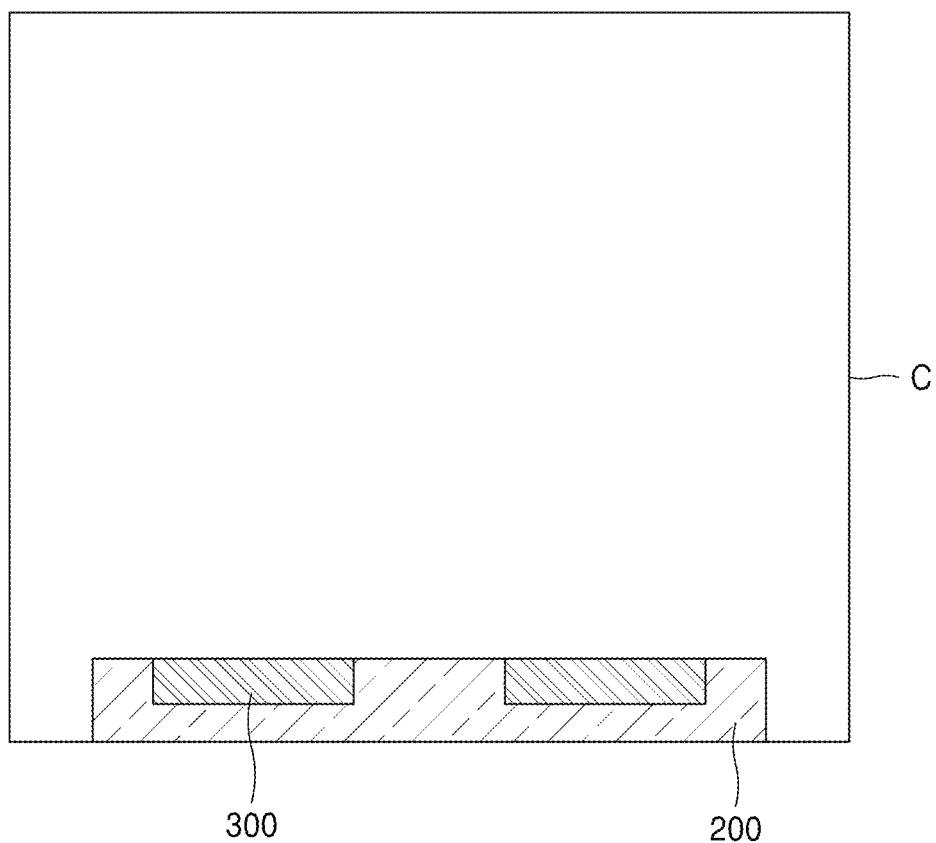
FIGS. 9A to 9E are views for explaining a method of forming nanocrystalline graphene according to an embodiment.

Referring to FIG. 9A, before growing nanocrystalline graphene 100 (in FIG. 9E), first, a pretreatment process is performed with respect to a surface of a substrate 200 having a desired and/or alternatively predetermined pattern 300 by using a reducing gas. Here, the pretreatment process of the substrate 200 having the desired and/or alternatively predetermined pattern 300 may be performed for the purpose of removing impurities or oxygen remaining on the surface of the substrate 200 having the desired and/or alternatively predetermined pattern 300.

Specifically, first, the substrate 200 having a desired and/or alternatively predetermined pattern 300 for growing nanocrystalline graphene 100 in the reaction chamber C is prepared. Here, the substrate 200 and the desired and/or alternatively predetermined pattern 300 may include various materials described with reference to FIG. 2A.

Figure 9B:
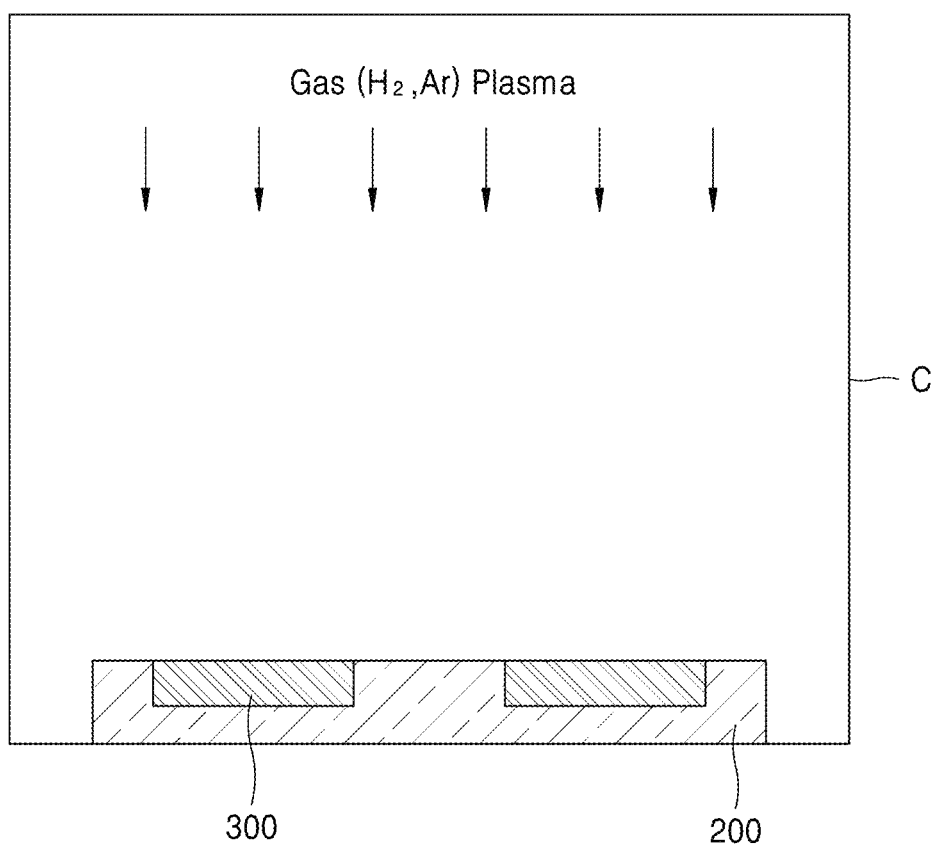

Next, referring to FIG. 9B, a gas for pretreatment of the substrate 200 having the desired and/or alternatively predetermined pattern 300 is injected into the reaction chamber C. At this time, a reducing gas may be used as the gas for the pretreatment. Here, the reducing gas may include, for example, at least one of hydrogen, nitrogen, chlorine, fluorine, ammonia, and derivatives thereof. However, the present disclosure is not limited thereto. In addition, an inert gas may be additionally injected into the reaction chamber C in addition to the reducing gas. Here, the inert gas may include, for example, at least one of argon gas, neon gas, helium gas, krypton gas, and xenon gas. In FIG. 9B, as an example, a case is shown in which hydrogen gas is used as the reducing gas and argon gas is used as the inert gas.

Next, power for plasma generation is applied to an inside of the reaction chamber C from a plasma power source. Here, the power for plasma generation may be in a range from about 10 W to about 4000 W, but is not limited thereto. As the plasma power source, for example, at least one RF plasma generator or at least one MW plasma generator may be used. However, the present disclosure is not limited thereto, and the substrate may be pretreated by using a heating method using a heating source rather than a plasma generation power source.

When power for plasma generation is applied to the inside of the reaction chamber C from a plasma power source, an electric field may be induced in the reaction chamber C. In this way, when an electric field is induced in a state in which a reducing gas (or a mixed gas of a reducing gas and an inert gas) is injected, plasma for pretreatment of the substrate is formed. A surface of the substrate 200 having the desired and/or alternatively predetermined pattern 300 may be treated by the plasma formed as above. The pretreatment process of the substrate 200 having the desired and/or alternatively predetermined pattern 300 may be performed in a state that a desired and/or alternatively predetermined voltage is applied to the substrate 200 having the desired and/or alternatively predetermined pattern 300. However, inventive concepts are not limited thereto, and a voltage may not be applied to the substrate 200 having the desired and/or alternatively predetermined pattern 300. Accordingly, impurities or oxygen remaining on the surface of the substrate 200 having the desired and/or alternatively predetermined pattern 300 may be removed. When the pretreatment process of the substrate 200 is completed, the gas or impurities remaining in the reaction chamber C may be discharged to the outside of the reaction chamber C.

Figure 9C:
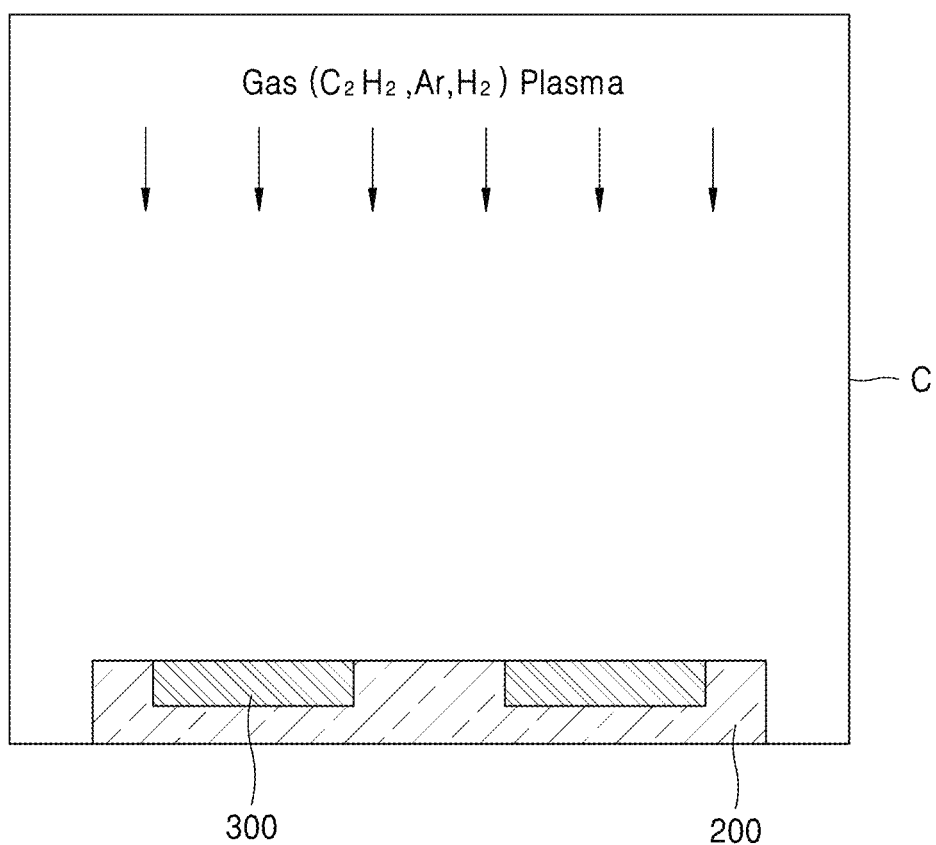
Figure 9D:
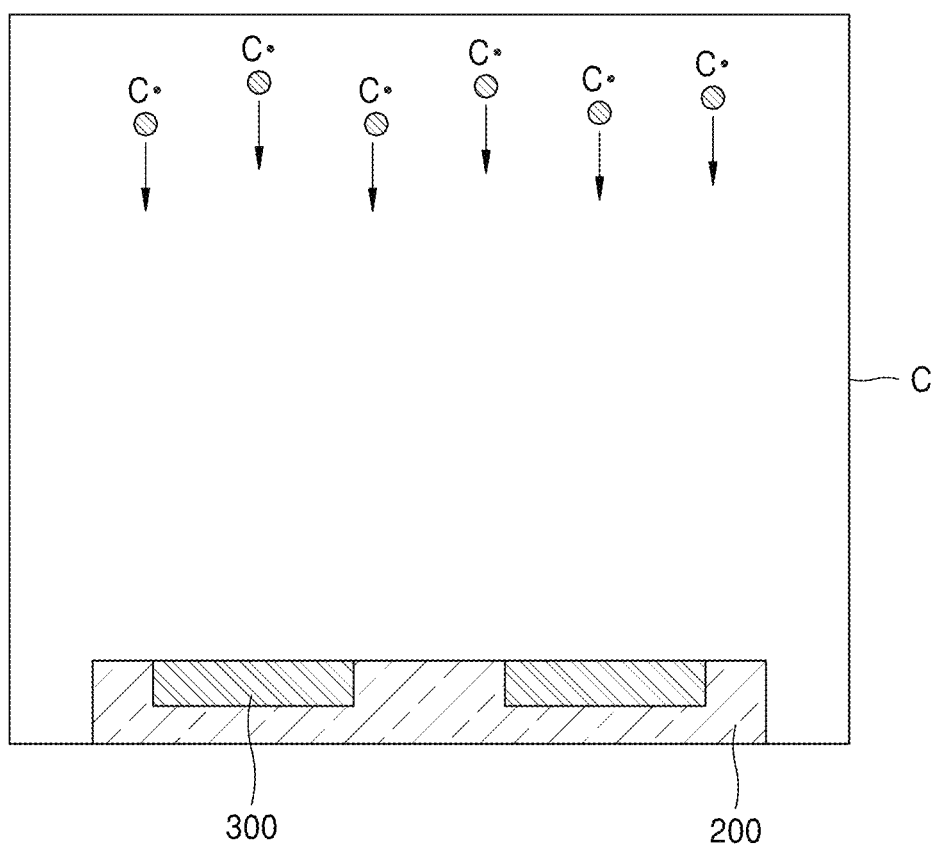
Figure 9E:
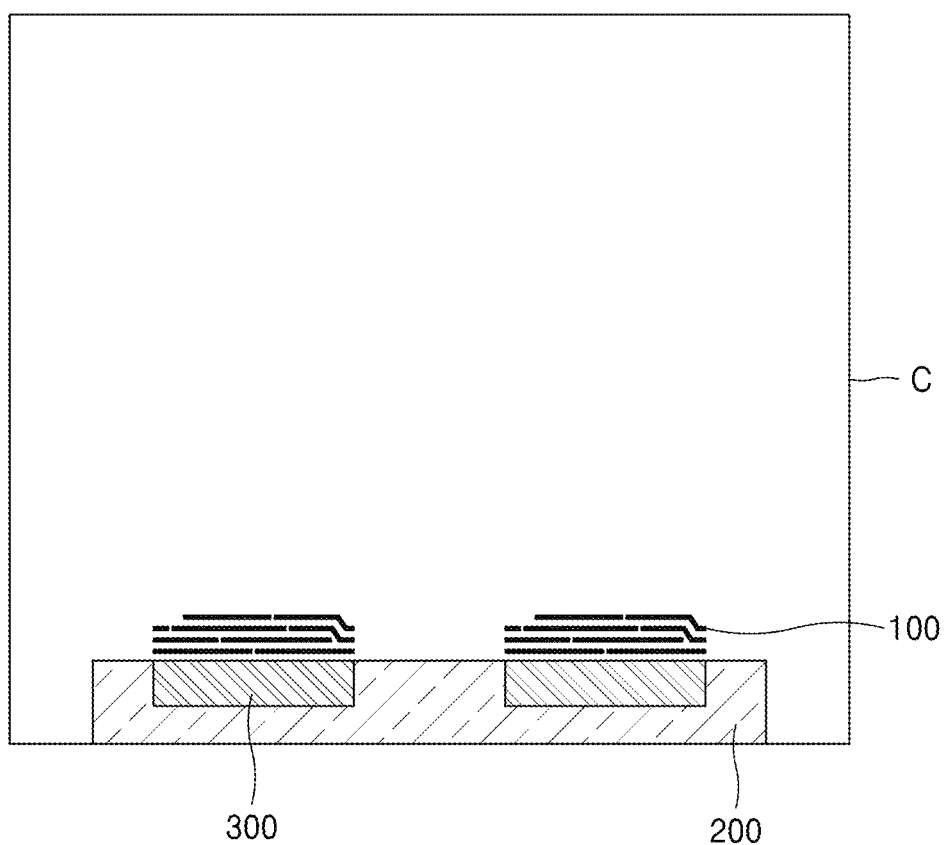

The method of forming the nanocrystalline graphene 100 shown in FIGS. 9C to 9E is substantially the same as the process shown in FIGS. 2B to 2D, and thus, the description thereof is omitted here for convenience of description. Through the substrate pretreatment process described above, it is possible to obtain high quality nanocrystalline graphene.

Figure 10A:
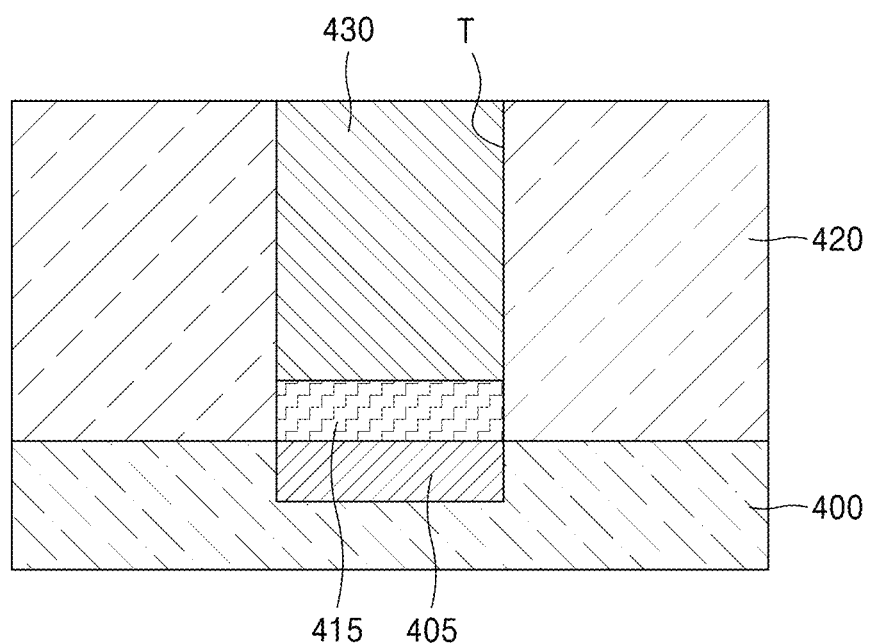
FIGS. 10A and 10B are cross-sectional views for explaining a method of forming an electronic device including an interconnect structure according to an embodiment.
Figure 10B:
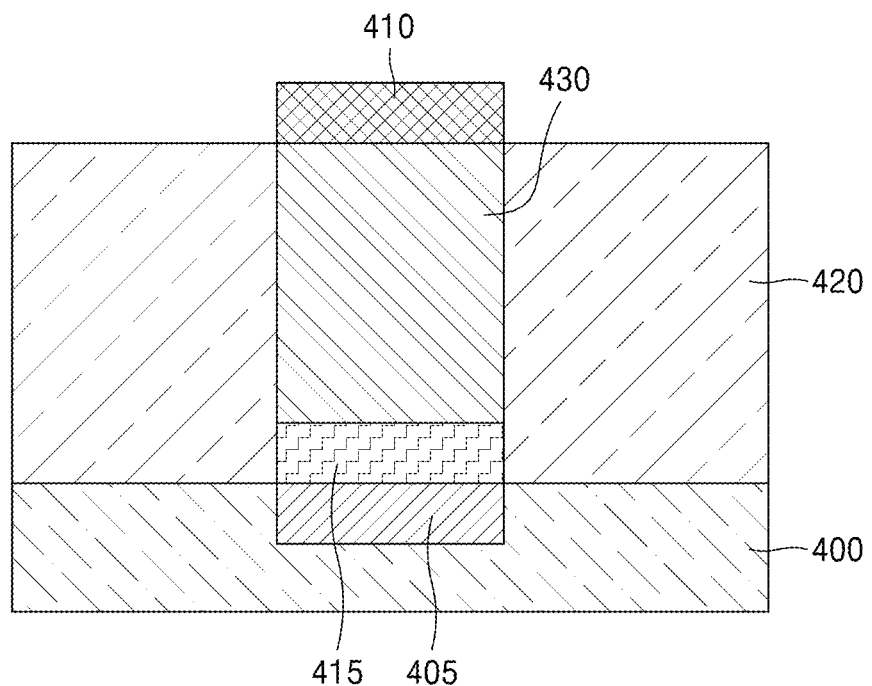

FIGS. 10A and 10B are cross-sectional views for explaining a method of forming an electronic device including an interconnect structure according to an embodiment.

Referring to FIG. 10A, a semiconductor structure may be prepared. The semiconductor structure may include a device portion 400 having a semiconductor region 405, a dielectric layer 420 on the device portion 400 and defining a trench T that exposes the semiconductor region 405, and an element layer 415 in the trench T on top of the semiconductor region 405. The device portion 400 and semiconductor region 405 may be part of a circuit (e.g., logic circuit, memory circuit, image sensor circuit). The element layer 415 may be an electrode connected to the semiconductor region 405 and may be a part of the circuit including the device portion 400 and semiconductor region 405. A conductive wiring 430 may fill the trench T and may be connected to the element layer 415. The dielectric layer 420 and conductive wiring 430 may include any one of the materials described above for the substrate 200 and pattern 300, respectively, described with reference to FIG. 2A. Although not illustrated, a barrier layer and/or liner layer may be formed in the trench T between sidewalls of the conductive wiring 430 and the sidewalls of the trench T.

In FIG. 10B, a nanocrystalline graphene 410 may be formed on an upper surface of the conductive wiring 430 without covering an upper surface of the dielectric layer 420. The method of forming the nanocrystalline graphene 410 shown in FIG. 10B may be substantially the same as the processes described in relation to FIG. 2A to 2D, 5A to 5B, or 9A to 9E; and thus, the description thereof is omitted here for convenience of description.

According to an embodiment, in a plasma chemical vapor deposition process, a mixed gas of a carbon source gas, an inert gas, and a hydrogen gas is used as a reactive gas, and a surface of a substrate is activated by plasma of the inert gas from among the mixed gas. Accordingly, even at a relatively low temperature of 550° C. or less, nanocrystalline graphene may be directly grown on the surface of the substrate in a relatively short time without a catalyst.

In addition, by varying a ratio of the carbon source gas, the inert gas, and the hydrogen gas, it is possible to selectively grow nanocrystalline graphene only in a desired and/or alternatively predetermined pattern included in the substrate. Accordingly, nanocrystalline graphene may be selectively grown according to a structure of a substrate having a pattern including different materials, and accordingly, nanocrystalline graphene may be formed only in a desired region of the substrate.

Also, high quality nanocrystalline graphene may be obtained through the pretreatment process of the substrate.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A method of forming a nanocrystalline graphene, the method comprising:
   arranging a substrate having a pattern in a reaction chamber;
   injecting a reaction gas into the reaction chamber, the reaction gas including a carbon source gas, an inert gas, and a hydrogen gas that are mixed;
   generating a plasma of the reaction gas in the reaction chamber; and
   directly growing the nanocrystalline graphene on a surface of the pattern using the plasma of the reaction gas at a process temperature, wherein
   the pattern comprises a first material and the substrate comprises a second material different from the first material, and
   the pattern is a conductive wiring.

2. The method of claim 1,
   wherein the first material includes a metal or metal alloy including at least one of Cu, Ru, Rh, Ir, Mo, W, Pd, Pt, Co, Ta, Ni, Al, and Ti, and
   wherein an upper surface of the pattern is coplanar with an upper surface of the substrate.

3. The method of claim 1,
   wherein the second material includes a dielectric material having a dielectric constant of 3.6 or less.

4. The method of claim 1,
   wherein while the directly growing the nanocrystalline graphene is performed using the plasma, a volume ratio of the hydrogen gas and the inert gas in the reaction gas is in a range from about 5:100 to about 100:1.

5. The method of claim 1,
wherein the generating the plasma of the reaction gas is performed by generating a radio frequency (RF) plasma or a microwave (MW) plasma, and
the directly growing the nanocrystalline graphene on the surface of the pattern using the plasma of the reaction gas at the process temperature selectively forms the nanocrystalline graphene on the surface of the pattern and does not selectively form the nanocrystalline graphene on a surface of the substrate next to the surface of the pattern.

6. The method of claim 5,
wherein the RF plasma has a frequency range of 3 MHz to 100 MHz and the MW plasma has a frequency range of 0.7 GHz to 2.5 GHz.

7. The method of claim 1,
wherein the generating the plasma is performed at a power in a range from about 10 W to about 1500 W.

8. The method of claim 1,
wherein the nanocrystalline graphene is grown at a process temperature of about 550° C. or less.

9. The method of claim 1,
wherein the nanocrystalline graphene is grown at a process pressure in a range from about 0.005 Torr to about 10 Torr.

10. The method of claim 1, wherein the carbon source gas includes at least one of:
a hydrocarbon gas; and
a vapor of a precursor including carbon.

11. The method of claim 10, wherein the precursor includes at least one of:
an aromatic hydrocarbon having a chemical formula of $C_xH_y$ ($6 \leq x \leq 42$, $6 \leq y \leq 28$) and derivatives thereof; and
$C_xH_y$ ($1 \leq x \leq 12$, $2 \leq y \leq 26$) aliphatic hydrocarbons and derivatives thereof.

12. The method of claim 1,
wherein the inert gas includes at least one of argon gas, nitrogen gas, helium gas, krypton gas, and xenon gas.

13. The method of claim 1,
wherein the nanocrystalline graphene includes crystals having a size in a range of about 0.5 nm to about 150 nm.

14. The method of claim 1,
wherein, in the nanocrystalline graphene, a ratio of carbon having an $sp^2$ bonding structure to total carbon is in a range from about 50% to about 99%.

15. The method of claim 1,
wherein the pattern is in a trench shape on the substrate.

16. The method of claim 1,
wherein the nanocrystalline graphene includes hydrogen in a range from about 1 at % to about 20 at %.

17. The method of claim 1,
wherein the nanocrystalline graphene has a density in a range of about 1.6 g/cc to about 2.1 g/cc.

18. The method of claim 1, further comprising:
pretreating a surface of the substrate using a reducing gas injected into the reaction chamber, wherein
the pretreating the surface of the substrate is performed before the directly growing the nanocrystalline graphene.

19. The method of claim 18,
wherein the reducing gas includes at least one of hydrogen, nitrogen, chlorine, fluorine, ammonia, and derivatives thereof.

20. The method of claim 19, further comprising:
injecting an inert gas into the reaction chamber.

* * * * *